US011847393B2

(12) United States Patent
Correia Grácio et al.

(10) Patent No.: US 11,847,393 B2
(45) Date of Patent: Dec. 19, 2023

(54) COMPUTING DEVICE AND METHOD FOR DEVELOPING A SYSTEM MODEL UTILIZING A SIMULATION ASSESSMENT MODULE

(71) Applicant: THE BOEING COMPANY, Chicago, IL (US)

(72) Inventors: Bruno J. Correia Grácio, Madrid (ES); Daniel Ramiro Rebollo, Madrid (ES); Pieter Van Gils, Madrid (ES)

(73) Assignee: THE BOEING COMPANY, Arlington, VA (US)

( * ) Notice: Subject to any disclaimer, the term of this patent is extended or adjusted under 35 U.S.C. 154(b) by 141 days.

(21) Appl. No.: 17/552,468

(22) Filed: Dec. 16, 2021

(65) Prior Publication Data

US 2022/0188494 A1    Jun. 16, 2022

(30) Foreign Application Priority Data

Dec. 16, 2020  (EP) .................................... 20383103

(51) Int. Cl.
  *G06F 30/3308*  (2020.01)
  *G06F 30/333*  (2020.01)
  (Continued)

(52) U.S. Cl.
  CPC ...... *G06F 30/3308* (2020.01); *G06F 11/3476* (2013.01); *G06F 30/333* (2020.01);
  (Continued)

(58) Field of Classification Search
  CPC ............. G06F 30/3308; G06F 30/3323; G06F 30/333; G06F 30/367; G06F 30/398; G06F 30/20; G06F 11/3476
  (Continued)

(56) References Cited

U.S. PATENT DOCUMENTS 6,090,728 A  7/2000 Yenni, Jr. et al.
6,265,466 B1  7/2001 Glatkowski et al.
(Continued)

FOREIGN PATENT DOCUMENTS

KR  20010051096 A  6/2001

OTHER PUBLICATIONS

Giannakopoulou, D. et al., "Assume-guarantee testing for software components," IET Software, 2(2):547-562, (Dec. 15, 2008).
(Continued)

*Primary Examiner* — Phallaka Kik
(74) *Attorney, Agent, or Firm* — ALSTON & BIRD LLP

(57) ABSTRACT

A computing device, method and computer program product are provided in order to develop a system model. In a method, a simulation model is designed that is configured to digitally simulate a corresponding portion of a system. The method also includes associating a simulation assessment module with the simulation model. The simulation assessment module is configured to verify one or more signals propagating within the simulation model. In an instance in which the simulation assessment module has verified the one or more signals, the method includes performing a unit test upon the simulation model to confirm proper operation of the simulation model. In an instance in which the unit test is successful, the method includes integrating a plurality of simulation models to form the system model.

20 Claims, 5 Drawing Sheets

(51) Int. Cl.
*G06F 30/3323* (2020.01)
*G06F 30/367* (2020.01)
*G06F 30/398* (2020.01)
*G06F 30/20* (2020.01)
*G06F 11/34* (2006.01)

(52) U.S. Cl.
CPC .......... *G06F 30/20* (2020.01); *G06F 30/3323* (2020.01); *G06F 30/367* (2020.01); *G06F 30/398* (2020.01)

(58) Field of Classification Search
USPC .......................... 716/106, 111, 136; 703/15
See application file for complete search history.

(56) References Cited

U.S. PATENT DOCUMENTS

| | | | |
|---|---|---|---|
| 6,741,019 B1 | 5/2004 | Filas et al. | |
| 7,430,498 B2 | 9/2008 | Butterfield et al. | |
| 7,934,185 B1* | 4/2011 | Ballagh | G06F 30/33 |
| | | | 716/136 |
| 8,014,371 B1 | 9/2011 | Miller et al. | |
| 9,824,243 B2* | 11/2017 | Chen | G06F 21/85 |
| 10,318,653 B1* | 6/2019 | Khoo | G06F 11/3668 |
| 10,592,703 B1* | 3/2020 | Ovadia | G06F 30/3312 |
| 2007/0118823 A1* | 5/2007 | Zhao | G06F 30/398 |
| | | | 716/112 |
| 2010/0293513 A1* | 11/2010 | Baumgartner | G06F 30/327 |
| | | | 716/103 |
| 2016/0346997 A1 | 12/2016 | Lewis et al. | |
| 2017/0039039 A1* | 2/2017 | Johnson | G06F 8/20 |
| 2017/0161403 A1* | 6/2017 | Mustafa | G06F 30/333 |
| 2018/0225165 A1* | 8/2018 | McGarvey | G06F 11/079 |
| 2021/0165748 A1* | 6/2021 | Suevern | G06F 13/382 |

OTHER PUBLICATIONS

European Patent Application No. 20383103.7, EP Search Report dated Jun. 2, 2021.

* cited by examiner

COMPUTING DEVICE AND METHOD FOR DEVELOPING A SYSTEM MODEL UTILIZING A SIMULATION ASSESSMENT MODULE

CROSS-REFERENCE TO RELATED APPLICATIONS

This application claims priority to European Patent Application No. 20383103.7, filed Dec. 16, 2020, the entire contents of which are incorporated herein by reference.

BACKGROUND

An example embodiment relates generally to a computing device and method for developing a system model and, more particularly, to a computing device and method for developing a system model that includes a simulation assessment module configured to verify one or more signals propagating within a simulation model. Digital models of a wide variety of systems are developed in order to simulate the corresponding system and to verify proper operation of the system under various operational conditions prior to fabrication of the corresponding system. Moreover, in an instance in which the digital model indicates that the corresponding system may not perform as intended under at least certain operational conditions, the portion of the system that may have created the deviation from the desired operational performance may be identified, thereby permitting the system to be reconfigured so as to achieve the desired operational performance in an efficient and timely manner.

Systems Model Based Design (sysMBD) develops models that digitally replicate a corresponding system while guaranteeing that the models are compliant with the requirements of the corresponding system. In a model-based systems design process, low-level models are initially developed on an individual basis and thereafter integrated to form the system model. Once a model has been developed, the individual model is unit tested to verify that the model satisfies the associated low-level requirements. After a number of models have been developed and have successfully passed the respective unit tests, groups of the models are integrated and the performance of the resulting group of models is verified at an upper level utilizing one or more integration tests. Once all of the individual model have been developed and successfully tested on an individual basis and then integrated and tested in groups at an upper level, system-level tests may be performed to verify that the entire system model satisfies the expected requirements. If the system-level test is satisfied, the resulting system model has been successfully verified and can be utilized, among other things, to simulate the performance of the corresponding system.

During the test procedures, one or more inputs may be provided to and one or more outputs may be received from a model, to/from a group of models or to/from the system model. In an instance in which the desired outputs in response to the inputs are obtained, the model, the group of models or the system model may be verified. However, in some instances, the outputs do not satisfy, and, instead, differ from the expected outputs in response to the inputs. In this situation, the model, the group of models or the system model are not successfully verified and a troubleshooting process is commenced in order to debug the model, the group of models or the system model. This troubleshooting procedure may result in modifications not only to one or more models, but also modifications that must similarly be made in the corresponding system in order to ensure that the corresponding system also operates properly. Re-design at the system level may be complex and expensive since the system will have already been built.

A model, a group of models or a system model are generally tested by applying a set of inputs and then analyzing the output(s) and/or one or more internal signals of the model. The output(s) and/or the one or more internal signals of the model may be presented in various manners including, for example, visually by use of an oscilloscope or a corresponding digital scope. This process of verifying the operation of the models that are eventually integrated to form a system model may be a time-consuming process as system models are commonly formed from hundreds, if not thousands, of models, each of which must be individually verified and, and some instances, debugged, prior to integrating the models into a system model and then further verifying the operation of the system model. Not only is this verification process generally time consuming, but the process may require extensive knowledge of the system and of low-level signals and interfaces between models by one or more teams of model developers for the model developer of any particular model to understand the manner in which the particular low-level model is to behave and to perform the particular simulations that are required to verify the proper operation of the model. These challenges with respect to the verification of individual models may lead to models being integrated into a system model that have not been fully tested and verified, thereby potentially leading to inconsistences during the performance of integration tests or system tests. These inconsistencies during integration tests and system tests are even more challenging to troubleshoot and more time consuming to debug as a result of the integration of a plurality of models, any of which may have caused the inconsistency noted by an integration test or a system test.

BRIEF SUMMARY

A computing device, method and computer program product are provided in accordance with an example embodiment in order to develop a system model, the operation of which may be verified in an efficient manner. In this regard, the computing device, method and computer program product of an example embodiment utilize simulation assessment modules to verify one or more signals propagating within a simulation model from which the system model is constructed. As a result, the performance of a simulation model may be verified at a low level prior to integration with other simulation models and simulation models that do not perform as anticipated may undergo a troubleshooting process prior to integration to debug the simulation model in an efficient manner. As a result, the integration tests and system tests that are subsequently performed following the integration of a plurality of simulation models can be successfully verified in a greater number of instances as a result of having identified and corrected any issues with the simulation models prior to the integration, thereby increasing the efficiency with which a system model may be developed.

In an example embodiment, a method is provided for developing a system model. The method includes designing a simulation model configured to digitally simulate a corresponding portion of a system. The method also includes associating a simulation assessment module with the simulation model. The simulation assessment module is configured to verify one or more signals propagating within the simulation model. In an instance in which the simulation assessment module has verified the one or more signals, the method includes performing a unit test upon the simulation model using a test harness to confirm proper operation of the simulation model. In an instance in which the unit test is successful, the method includes integrating a plurality of simulation models to form the system model.

The simulation model of an example embodiment has one or more inputs and one or more outputs. In this example embodiment, the method performs a unit test by evaluating the one or more outputs of the simulation model in response to the one or more inputs. In this example embodiment, the simulation assessment module may also be configured to verify one or more internal signals that are propagating within the simulation model and that are different than the one or more outputs of the simulation model.

The method of an example embodiment associates the simulation assessment module with the simulation model by defining verification logic implemented by the simulation assessment module, by defining a response to a failure to verify the one or more signals propagating within the simulation model, and/or by defining whether data associated with verification of the one or more signals propagating within the simulation model is to be logged. In an example embodiment, the method associates a plurality of simulation assessment modules with the simulation model. Each simulation assessment module of this example embodiment is configured to verify one or more different signals or different relationships between signals propagating within the simulation model. In an example embodiment, the method performs the unit test upon the simulation model by creating the unit test based at least in part upon verification results of the simulation assessment module. The simulation assessment module of an example embodiment is configured to verify a relationship of two or more signals or a value of one or more signals.

In another example embodiment, a computing device is provided that is configured to develop a system model. The computing device includes processing circuitry configured to receive input to design a simulation model configured to digitally simulate a corresponding portion of a system. The processing circuitry is also configured to associate a simulation assessment module with the simulation model. The simulation assessment module is configured to verify one or more signals propagating within the simulation model. In an instance in which the simulation assessment module has verified the one or more signals, the processing circuitry is also configured to perform a unit test upon the simulation model using a test harness to confirm proper operation of the simulation model. In an instance in which the unit test is successful, the processing circuitry is further configured to integrate a plurality of simulation models to form the system model.

The simulation model of an example embodiment has one or more inputs and one or more outputs. In this example embodiment, the processing circuitry is configured to perform a unit test by evaluating the one or more outputs of the simulation model in response to the one or more inputs. In this example embodiment, the simulation assessment module may also be configured to verify one or more internal signals that are propagating within the simulation model and that are different than the one or more outputs of the simulation model.

The processing circuitry of an example embodiment is configured to associate the simulation assessment module with the simulation model by defining verification logic implemented by the simulation assessment module, by defining a response to a failure to verify the one or more signals propagating within the simulation model, and/or by defining whether data associated with verification of the one or more signals propagating within the simulation model is to be logged. In an example embodiment, the processing circuitry is configured to associate a plurality of simulation assessment modules with the simulation model. Each simulation assessment module of this example embodiment is configured to verify one or more different signals or different relationships between signals propagating within the simulation model. In an example embodiment, the processing circuitry is configured to perform the unit test upon the simulation model by creating the unit test based at least in part upon verification results of the simulation assessment module. The simulation assessment module of an example embodiment is configured to verify a relationship of two or more signals or a value of one or more signals.

In a further example embodiment, a computer program product is provided that is configured to develop a system model. The computer program product includes a non-transitory computer readable medium having program code stored thereon with the program code including program code instructions configured, upon execution, to receive input to design a simulation model configured to digitally simulate a corresponding portion of a system. The program code also includes program code instructions configured to associate a simulation assessment module with the simulation model. The simulation assessment module is configured to verify one or more signals propagating within the simulation model. In an instance in which the simulation assessment module has verified the one or more signals, the program code also includes program code instructions configured to create and perform a unit test upon the simulation model using a test harness to confirm proper operation of the simulation model. In an instance in which the unit test is successful, the program code further includes program code instructions configured to integrate a plurality of simulation models to form the system model.

The simulation model of an example embodiment has one or more inputs and one or more outputs. In this example embodiment, the program code instructions are configured to perform a unit test by evaluating the one or more outputs of the simulation model in response to the one or more inputs. In this example embodiment, the simulation assessment module may also be configured to verify one or more internal signals that are propagating within the simulation model and that are different than the one or more outputs of the simulation model.

The program code instructions of an example embodiment are configured to associate the simulation assessment module with the simulation model by defining verification logic implemented by the simulation assessment module, by defining a response to a failure to verify the one or more signals propagating within the simulation model, and/or by defining whether data associated with verification of the one or more signals propagating within the simulation model is to be logged. In an example embodiment, the program code instructions are configured to associate a plurality of simulation assessment modules with the simulation model. Each simulation assessment module of this example embodiment is configured to verify one or more different signals or different relationships between signals propagating within the simulation model. In an example embodiment, the program codes instructions are configured to perform the unit test upon the simulation model by creating the unit test based at least in part upon verification results of the simulation assessment module. The simulation assessment module of an example embodiment is configured to verify a relationship of two or more signals or a value of one or more signals.

BRIEF DESCRIPTION OF THE FIGURES

Figure 1:
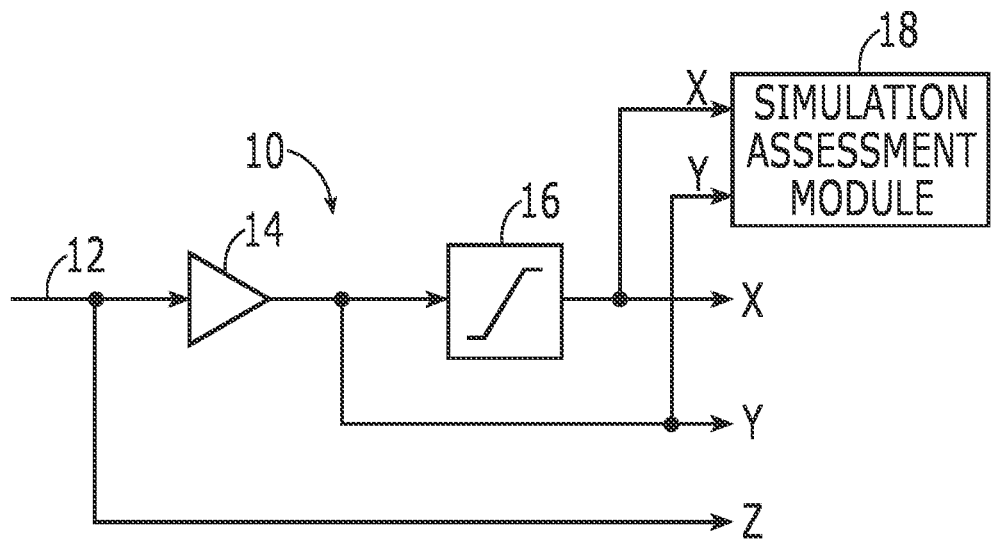
Figure 2:
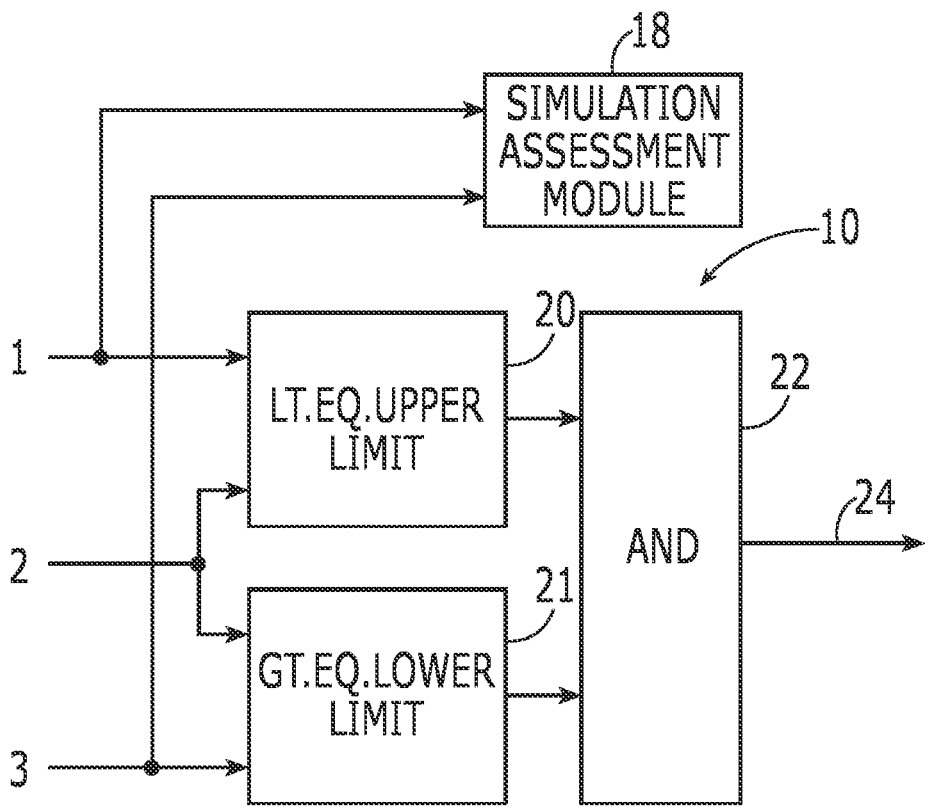
Figure 3:
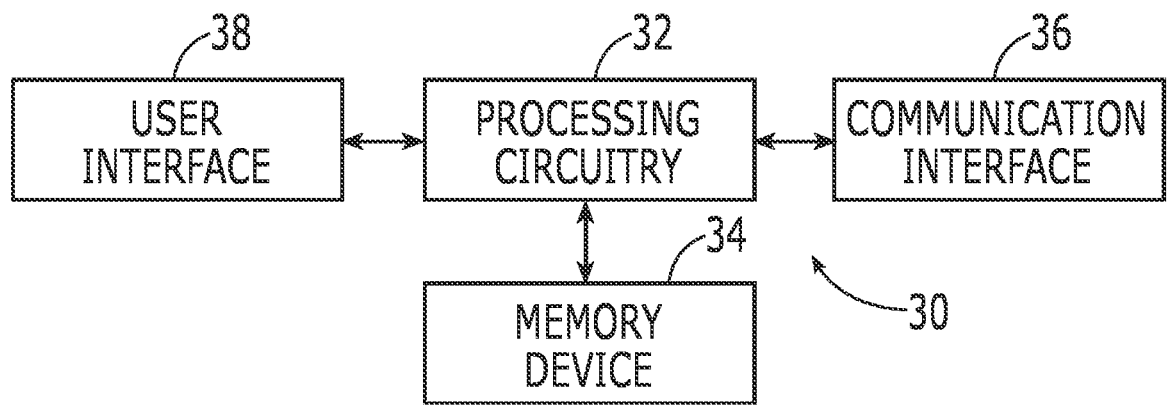
Figure 4:
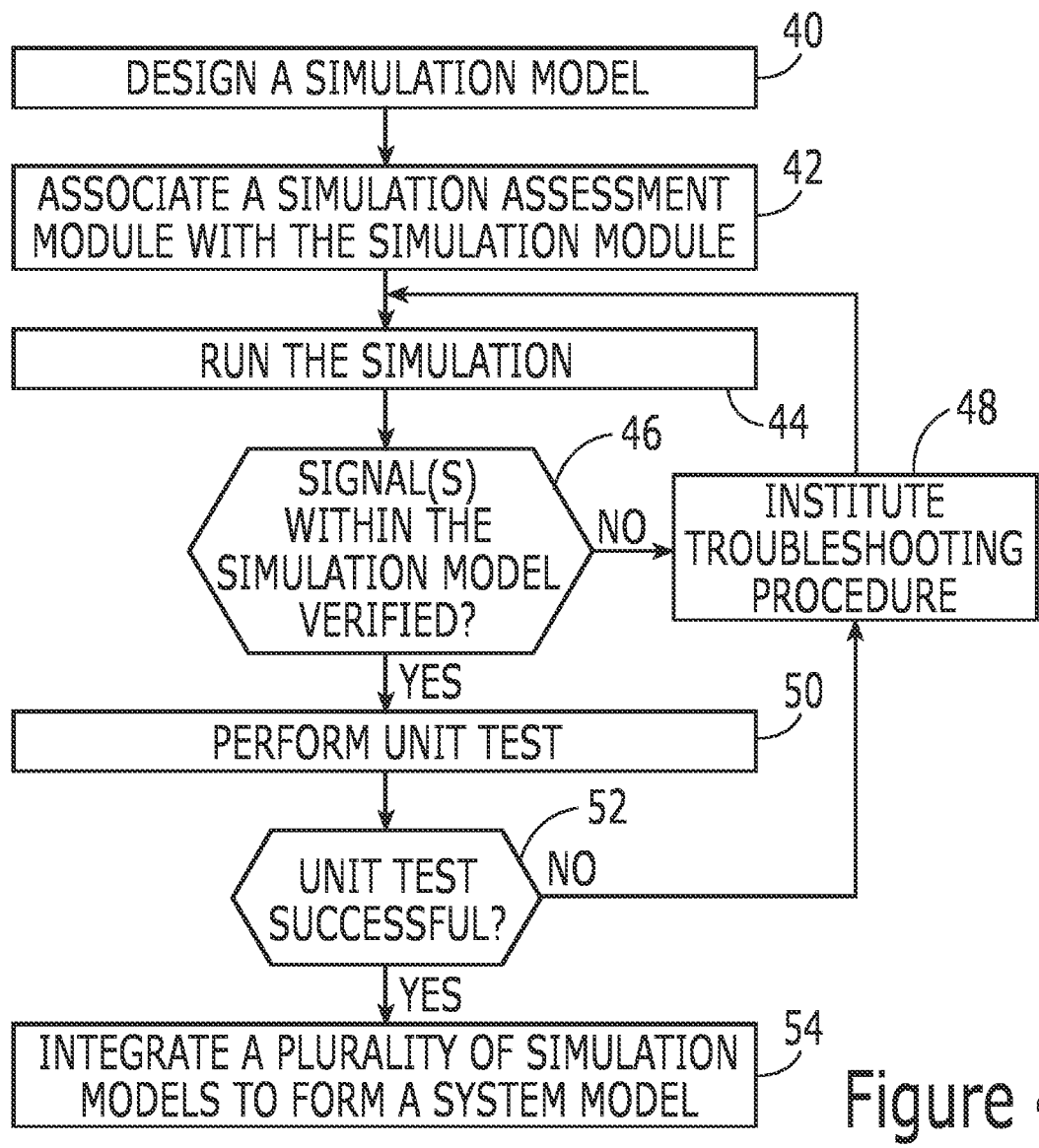
Figure 5:
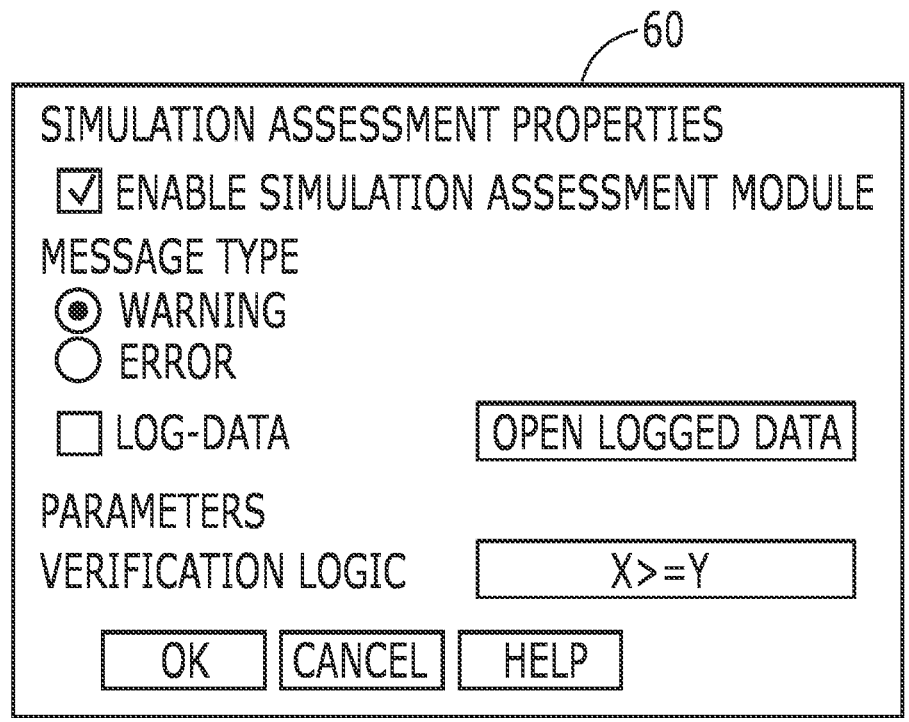
Figure 6:
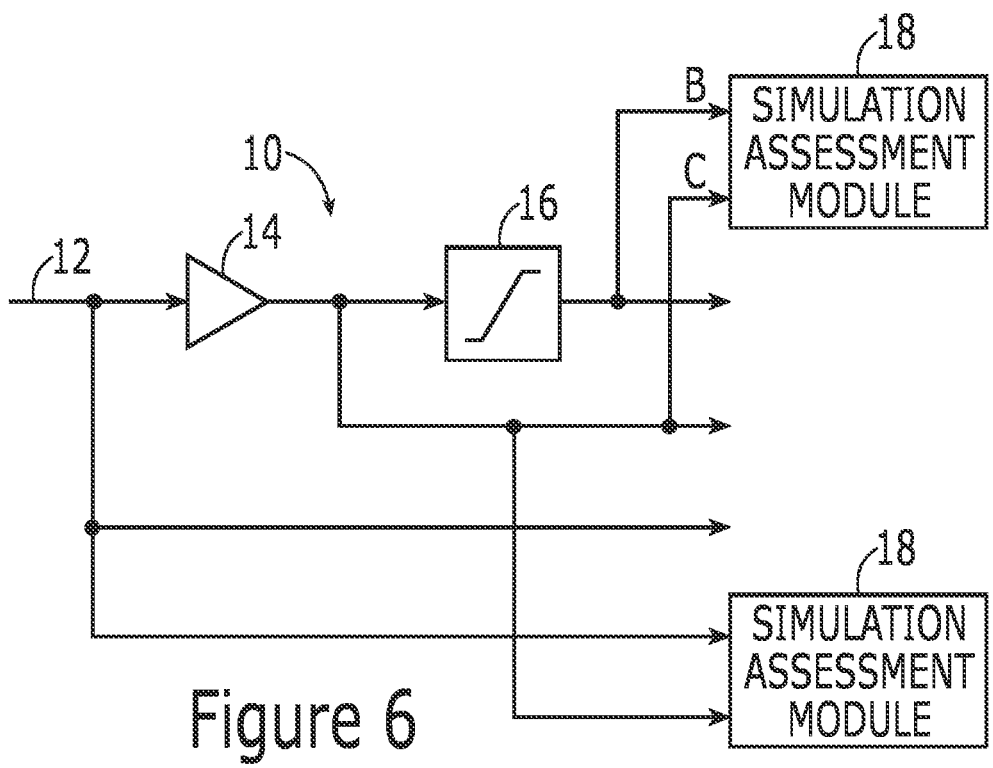
Figure 7:
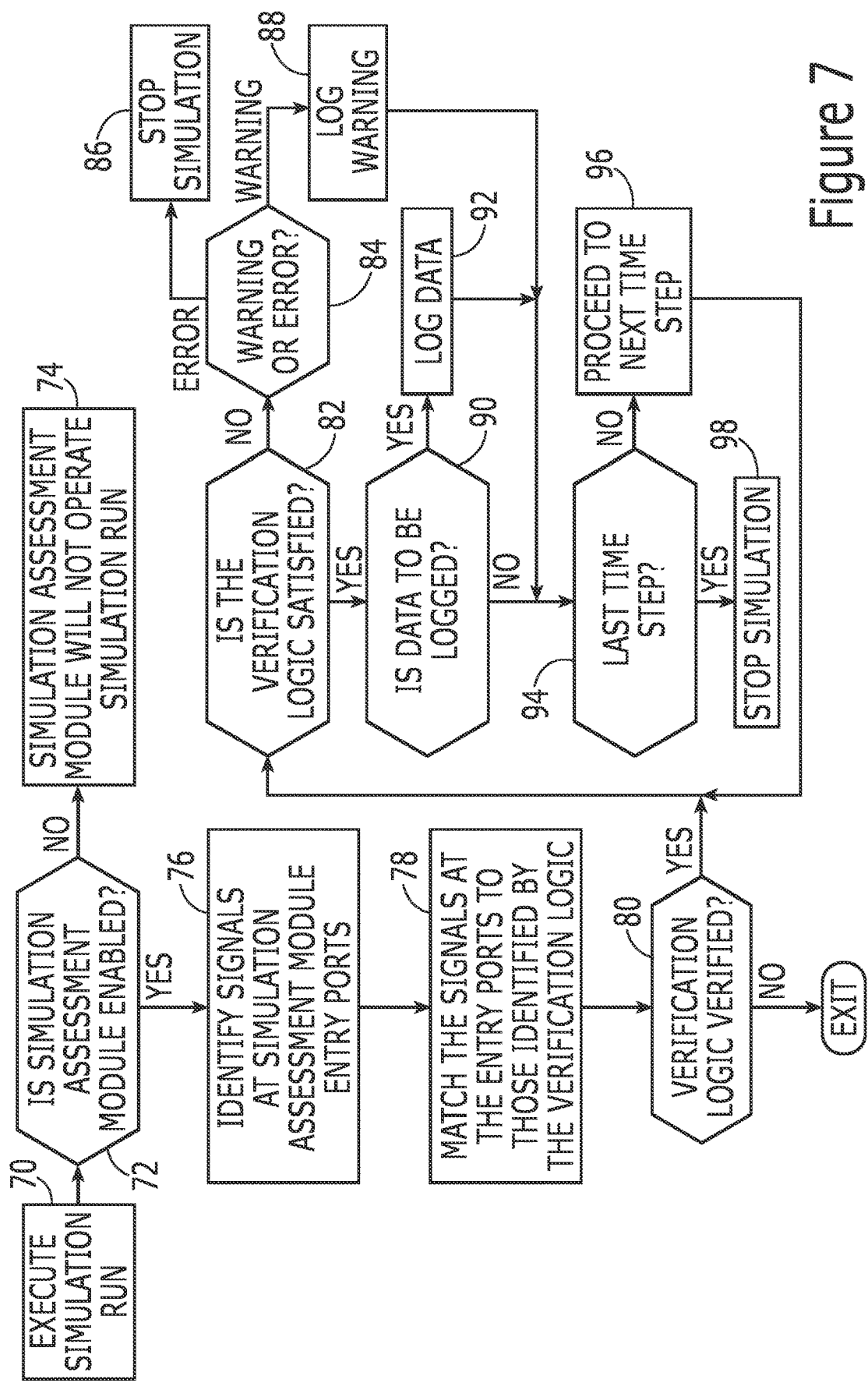
Figure 8:
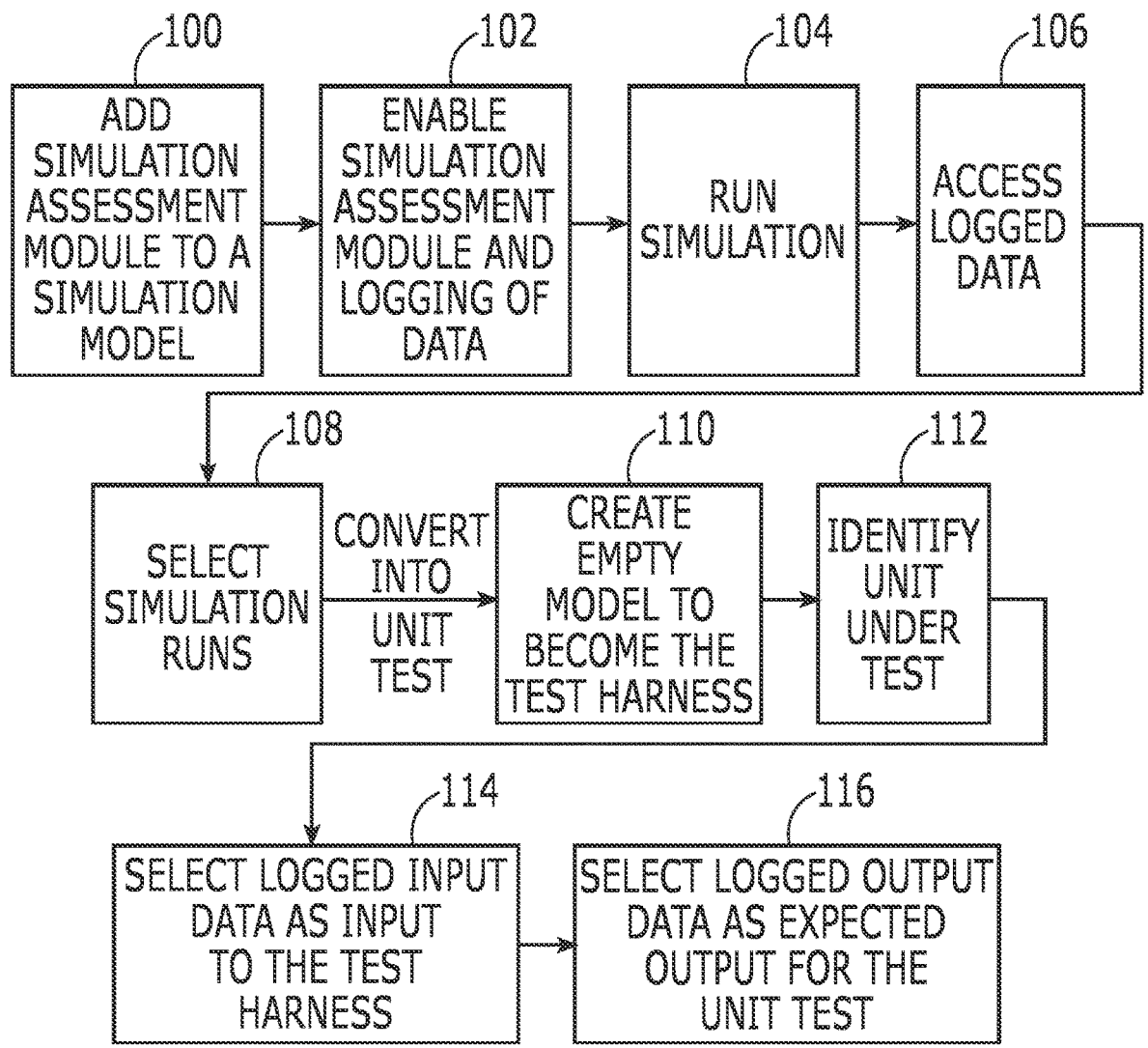

Having thus described certain example embodiments of the present disclosure in general terms, reference will hereinafter be made to the accompanying drawings, which are not necessarily drawn to scale, and wherein:

FIG. 1 is an example of a simulation model and a simulation assessment module in accordance with an example embodiment of the present disclosure;

FIG. 2 illustrates another simulation model and an associated simulation assessment module in accordance with another example embodiment of the present disclosure;

FIG. 3 is a block diagram illustrating a computing device that may be specifically configured in accordance with an example embodiment of the present disclosure;

FIG. 4 is a flow chart illustrating operations performed, such as by the computing device of FIG. 3, in accordance with an example embodiment of the present disclosure;

FIG. 5 illustrates a graphical user interface that may be presented, such as by the computing device of FIG. 3, in order to configure the simulation assessment module in accordance with an example embodiment of the present disclosure;

FIG. 6 illustrates a simulation model associated with two different simulation assessment modules in accordance with an example embodiment of the present disclosure;

FIG. 7 is a flow chart illustrating operations performed, such as by the computing device of FIG. 3, during simulation in accordance with an example embodiment of the present disclosure; and FIG. 8 is a flow chart illustrating operations performed, such as by the computing device of FIG. 3, in order to create a unit test based at least in part upon verification results of a simulation assessment module in accordance with an example embodiment of the present disclosure.

DETAILED DESCRIPTION

The present disclosure now will be described more fully hereinafter with reference to the accompanying drawings, in which some, but not all aspects are shown. Indeed, the disclosure may be embodied in many different forms and should not be construed as limited to the aspects set forth herein. Rather, these aspects are provided so that this disclosure will satisfy applicable legal requirements. Like numbers refer to like elements throughout.

A computing device, method and computer program product are provided in order to develop a system model utilizing a simulation assessment module to verify one or more signals propagating within a simulation model from which the system model is constructed. The system model is a digital model of a corresponding system. The system model permits the performance of the corresponding system to be digitally simulated so as to determine whether the system model and, as a result, the corresponding system operates as anticipated under all of the various operational conditions. A system model may correspond to any of a wide variety of different types of systems including communication systems, control systems and the like. The systems to which the system model corresponds may not only be of various different types so as to service different applications, but may be constructed in various manners including, for example, software-based systems.

By simulating the performance of a corresponding system utilizing the system model, instances in which the system model and, as a result, the corresponding system do not perform properly can be identified and troubleshooting procedures may be instituted in order to debug the system model. Based upon the results of the troubleshooting procedure, and modifications to the system model, the corresponding system may be similarly modified such that the corresponding system will also operate properly following the modification. By simulating the performance of a system utilizing a system model and then implementing the troubleshooting procedure, if necessary, in relation to the system model, the corresponding system may also debugged in an efficient and timely manner relative to a process in which the system itself is subjected to a troubleshooting procedure without the benefit of the simulation performed upon the system model.

Although a system model may be configured in a variety of manners, the system model of an example embodiment includes one or more units, each of which includes one or more simulation models that are integrated to form the system model. Each simulation model performs the function of a respective portion of a corresponding system. In one embodiment each unit includes a plurality of simulation models that are integrated to form the respective unit. In some embodiments, a plurality of the units may be integrated into a group of units and a plurality of groups of units may, in turn, be integrated to form the system model.

A simulation model may be configured to perform a wide variety of different functions depending upon the respective portion of the corresponding system that is represented by the simulation model. Two examples of simulation models 10 are illustrated in FIGS. 1 and 2. However, the simulation models of FIGS. 1 and 2 are presented by way of example and not of limitation as other simulation models may be configured to perform a wide variety of other functions. In FIG. 1, an input 12 is received by the simulation model and three outputs designated X, Y and Z are generated by the simulation model. The simulation model includes an amplifier 14 that doubles the input and a limiter 16 that limits the resulting value generated by the amplifier so as equal or to lie between upper and lower limits. The output X represents the output of the limiter, the output Y represents the output of the amplifier and the output Z represents the input to the amplifier. As shown in FIG. 1, a simulation assessment module 18 is associated with the simulation model and serves to verify that one or more signals that propagate through the simulation model satisfy a predefined requirement. For example, the simulation assessment module associated with the simulation model of FIG. 1 receives outputs X and Y and may be configured to verify that the absolute value of the output X is less than or equal to the absolute value of output Y for every time instance. This relationship that is verified by the simulation assessment module must be satisfied under all conditions if the simulation model is to be operating properly.

By way of another example, FIG. 2 depicts another simulation model 10. The simulation model of FIG. 2 includes three inputs designated 1, 2 and 3. Inputs 1 and 3 define the upper limit and lower limits, respectively, of a range and input 2 is an input signal that is compared to the upper and lower limits by the comparator circuitry 20 and comparator circuitry 21, respectively, and the And circuitry 22 to determine whether the input signal lies within the range or outside of the range. In this regard, the input signal is compared to the upper limit by the comparator circuitry 20 with the comparator circuity 20 providing a positive output in an instance in which the input signal is less than or equal to (LT.EQ.UPPER LIMIT). The input signal is also compared to the lower limit by the comparator circuitry 21 with the comparator circuity 21 providing a positive output in an instance in which the input signal is greater than or equal to (GT.EQ.LOWER LIMIT). The simulation model generates an output signal 24 designated valid that is true in an instance in which the input signal falls within the range bounded by the upper and lower limits, but is otherwise false. The upper and lower limits of the range may be constant or may be change over time based on the inputs 1 and 3.

In the example embodiment of FIG. 2, a simulation assessment module 18 is associated with the simulation model 10 to verify that the value of the upper limit of the range as defined by input 1 exceeds the value of the lower limit of the range as defined by input 3 in all time instances. As such, even in an instance in which the simulation model is utilized by a designer who did not develop the simulation model and, as such, may not be familiar with the operation of the simulation model and the assumptions upon which the simulation model operates, such as in an instance in which the simulation model is included within a library of simulation models that is referenced by any number of designers, the simulation assessment module ensures that the simulation model is utilized properly by the other designer. As FIG. 2 demonstrates, the simulation assessment module of an example embodiment verifies the proper operation of the logic by which the output is provided in contrast to a conventional test that verifies only the output without consideration of the inner logic by which the output is provided.

In order to verify the operation of a system model comprised of a plurality of simulation models, a computing device, method and computer program product of an example embodiment utilize simulation assessment modules associated with respective simulation models in order to verify the proper operation of the respective simulation models based upon one or more signals propagating through the respective simulation models. The simulation assessment modules are able to verify at least certain operational aspects of the simulation models at a low level prior to integration of simulation models into units and prior to the integration of units into a groups of units and, in turn, into a system model. Thus, evaluation of the results of a simulation assessment module permits instances in which a simulation model fails to perform as anticipated under certain operational conditions to be identified and for a troubleshooting procedure to be instituted in order to debug the simulation model prior to its integration. By identifying an error in operation at the low level of a simulation model, the troubleshooting and debugging procedure may be performed more efficiently and earlier in the sysMBD development lifecycle than if the troubleshooting and debugging were performed following integration of the simulation model with other simulation models. As a result of the verification provided by the simulation assessment modules, the confidence in the proper operation of the simulation models and, in turn, the confidence that the overall system model will operate properly is greater than if the troubleshooting and debugging procedures were first performed in conjunction with the system model following integration of a plurality of simulation models.

The computing device that is configured to develop a system model in accordance with an example embodiment may be embodied by any of a wide variety of different types of computers or computer systems. For example, the computing device may be embodied by a server, a computer workstation, a network of a distributed computing devices, a personal computer, etc. Regardless of the manner in which the computing device 30 is embodied, however, the computing device may include, be associated with or be in communication with processing circuitry 32, a memory device 34 and optionally a communication interface 36 and/or a user interface 38 as shown in FIG. 3.

The processing circuitry 32 may, for example, be embodied as various means including one or more microprocessors, one or more coprocessors, one or more multi-core processors, one or more controllers, one or more computers, various other processing elements including integrated circuits such as, for example, an ASIC (application specific integrated circuit) or FPGA (field programmable gate array), or some combination thereof. In some example embodiments, the processing circuitry is configured to execute instructions stored in the memory device 34 or otherwise accessible to the processing circuitry. These instructions, when executed by the processing circuitry, may cause the computing device 30 to perform one or more of the functionalities described herein. As such, the computing device may comprise an entity capable of performing operations according to embodiments of the present disclosure while configured accordingly. Thus, for example, when the processing circuitry is embodied as an ASIC, FPGA or the like, the processing circuitry and, correspondingly, the computing device may comprise specifically configured hardware for conducting one or more operations described herein. Alternatively, as another example, when the processing circuitry is embodied as an executor of instructions, such as may be stored in the memory device, the instructions may specifically configure the processing circuitry and, in turn, the computing device to perform one or more algorithms and operations described herein.

The memory device 34 may include, for example, non-volatile memory. The memory device may comprise, for example, a hard disk, random access memory, cache memory, flash memory, an optical disc (e.g., a compact disc read only memory (CD-ROM), digital versatile disc read only memory (DVD-ROM), or the like), circuitry configured to store information, or some combination thereof. In this regard, the memory device may comprise any non-transitory computer readable storage medium. The memory device may be configured to store information, data, applications, instructions, or the like for enabling the computing device 30, such as the processing circuitry 32, to carry out various functions in accordance with example embodiments of the present disclosure. For example, the memory device may be configured to store program instructions for execution by the processing circuitry.

The communication interface 36 may be in communication with the processing circuitry 32 and the memory device 34 and may be configured to receive and/or transmit data, such as described below. The communication interface may include, for example, one or more antennas and supporting hardware and/or software for enabling communications with a wireless communication network. Additionally or alternatively, the communication interface may include the circuitry for interacting with the antenna(s) to cause transmission of signals via the antenna(s) or to handle receipt of signals received via the antenna(s). In some environments, the communication interface may alternatively or also support wired communication.

If the computing device 30 includes a user interface 38, the user interface may be in communication with the processing circuitry 32 and the memory device 34 to receive an indication of a user input and/or to provide an audible, visual, mechanical, or other output to a user. As such, the user interface may include, for example, a display and one or more speakers for providing visual and audible output to a user. Other examples of the user interface include a keyboard, a mouse, a joystick, a microphone and/or other input/output mechanisms.

The operations performed, such as by the computing device 30, in accordance with an example embodiment are depicted in FIG. 4. As shown in block 40 of FIG. 4, the computing device includes means, such as the processing circuitry 32, communication interface 36 or the like, for receiving input from which to design a simulation model 10 configured to digitally simulate a corresponding portion of a system. In some embodiments, a plurality of simulation models configured to digitally simulate different corresponding portions of a system have been previously developed and are stored by and retrieved from a library housed by the memory device 34 or a database with which the computing device is in communication. In this example embodiment, the input that is received to design a simulation model may be input that identifies the simulation model within the library that is to be selected. Alternatively, the input of this example embodiment may be input that provides the simulation model itself, such as the software code or pseudocode that defines the simulation model. In another embodiment, the simulation model may not have been previously developed and available for selection. In this instance, the input that is received to design the simulation model may define the simulation model itself, such as the different elements of the simulation model and the order and manner in which those elements are interconnected.

Regardless of the manner in which the simulation model is designed, the computing device 30 of an example embodiment also includes means, such as the processing circuitry 32 or the like, for associating a simulation assessment module 18 with the simulation model 10. See block 42 of FIG. 4. The simulation assessment module is configured to verify one or more signals propagating within the simulation model. In this regard, the simulation model generally has one or more inputs and one or more outputs. In contrast to conventional verification procedures that evaluate the output of a system model in response to a predefined input, the simulation assessment module of one example embodiment is configured to verify one or more internal signals that are propagating within the simulation model and that are different than the one or more outputs of the simulation model. The verification of one or more internal signals may be in addition to or instead of verification of one or more outputs of the simulation model. In this regard, some simulation assessment modules evaluate internal signals of the simulation model, that is, signals within the simulation model that are neither inputs nor outputs of the simulation model. Alternatively, the simulation assessment module may evaluate two or more outputs, such as the relationship of two or more outputs, without consideration of the inputs. Still further, the simulation assessment module of another example embodiment may evaluate two or more inputs, such as the relationship with two or more inputs as shown in FIG. 2, without consideration of the outputs of the simulation model. Other embodiments, such as depicted in FIG. 1, evaluate a combination of internal signal(s) and one or more inputs or outputs of a simulation model.

In an example embodiment, the processing circuitry 32 is configured to associate the simulation assessment module 18 with the simulation model 10 by defining verification logic that is to be implemented by the simulation assessment module. The verification logic defines the evaluation of the one or more signals propagating within the simulation model that is to be performed by the simulation assessment module. As described above in conjunction with FIGS. 1 and 2, the verification logic implemented by simulation assessment module may define a relationship between two or more signals, such as by requiring one signal to have a greater value than another signal. The verification logic that is defined in conjunction with the association of the simulation assessment module with the simulation model may specify any of a wide variety of relationships between the signals and/or may define other conditions that the individual signals must satisfy independent of any relationship between the signals, such as a signal having a constant value, a signal being positive, a signal decreasing over time, etc.

The processing circuitry 32 of an example embodiment may also be configured to associate the simulation assessment module 18 with the simulation model 10 by defining a response to the failure to verify the one or more signals propagating within the simulation model. In this regard, the response that is defined dictates the manner in which the simulation assessment module will react to a failure to verify the one or more signals propagating within the simulation model. While various types of responses may be defined, one response to a failure to verify the one or more signals propagating within the simulation model may be a warning in which the failure to verify the one or more signals propagating within the simulation model is identified, but operation of the system model continues. The warning may be presented by the user interface 38 or transmitted via the communication interface 36 to one or more recipients. In response to a warning, the simulation model may continue to operate, albeit with the warning being flagged for consideration, such as by the model designer. Alternatively, the response to a failure to verify the one or more signals propagating within the simulation model may be an error that causes the operation the simulation model to be halted. The type of response, e.g., warning or error, that is defined may be dependent upon the severity of the failure with more severe failures being identified as errors and less significant failures being identified as warnings.

Additionally or alternatively, the processing circuitry 32 of an example embodiment may be configured to associate the simulation assessment module 18 with the simulation model 10 by defining whether data associated with the verification of the one or more signals propagating within the simulation model is to be logged. In instances in which the data is to be logged, the processing circuitry is configured to store the data, such as in the memory device 34 or a database with which the computing device 30 is in communication. Alternatively, if the data is not to be logged, data associated with the verification of the one or more signals propagating within the simulation model is not stored. In an instance in which the data is to be logged, a variety of different types of data may be logged including, for example, the time of which the verification was performed, the respective values of the one or more signals at the time of the verification (and/or in advance of or following the time of verification) and/or other conditions relevant to the simulation model at the time of the verification.

In an instance in which the data is logged, a record is therefore established of the results of the verification of the one or more signals propagating within the simulation model 10. In this regard, in instances in which the simulation model is verified to be performing in the anticipated manner, the data is logged to evidence the proper performance of the simulation model. However, in an instance in which the simulation model is not performing as anticipated, the data that is logged may be utilized to facilitate the troubleshooting procedure and to debug the simulation model.

The association of the simulation assessment module 18 with the simulation model 10 may be performed in various manners. In an example embodiment, however, the computing device 30, such as the processing circuitry 32, is configured to cause a graphical user interface to be presented, such as upon the user interface 38, that solicits input from a model designer regarding the simulation assessment module to be associated with the simulation model. Although a variety of different graphical user interfaces soliciting a variety of different types of information may be presented, one example of a graphical user interface 60 is presented in FIG. 5.

As shown, the graphical user interface 60 prompts the model designer to define the response to a failure to verify the one or more signals propagating within the simulation model 10 to be a warning or an error. Additionally, the graphical user interface of the illustrated embodiment prompts the model designer to select whether the data associated with the verification of the one or more signals propagating within the simulation model is be logged or not. Further, the graphical user interface of this example embodiment prompts the model designer to define the verification logic to be implemented by the simulation assessment module 18. In this regard, the verification logic defines the particular signals to be verified, such as by reference to the designation of the signals provided by the simulation model, such as 1, 2, 3, X, Y, Z, etc., as well as any condition or state of the individual signals to be verified and/or any relationship to be verified between two or more of the signals.

Although FIGS. 1 and 2 depict a single simulation assessment module 18 to be associated with a respective simulation model 10, the processing circuitry 32 of another example embodiment is configured to associate a plurality of simulation of assessment modules with the same simulation model. An example of a simulation model with which two simulation assessment modules are associated is depicted in FIG. 6. As shown in FIG. 6, each simulation assessment module is configured to verify one or more different signals or different relationships between signals propagating within the simulation model.

As shown in block 44 of FIG. 4, the computing device 30, such as the processing circuitry 32, is configured to run the simulation of the simulation model 10. In an instance in which the simulation assessment module 18 fails to verify the one or more signals propagating through the simulation model, the simulation model may be subjected to a troubleshooting procedure so as to debug the simulation model and to ensure that the resulting simulation model, as debugged, performs as anticipated under all operational scenarios. See blocks 46 and 48. In some embodiments, the computing device 30 includes means, such as the processing circuitry 32 or the like, for performing the troubleshooting procedure, such as in cooperation with, for example, the model designer, in an instance in which the simulation assessment module has provided a warning and/or an error. Alternatively, the troubleshooting procedure may be performed manually, such as by the model designer. Depending upon the manner in which the simulation assessment module is associated with the simulation model, the data associated with the verification of the simulation model may be logged. As such, the data that has been logged may be referenced in order to facilitate the troubleshooting procedure.

In contrast, in an instance in which the simulation assessment module 18 has verified the one or more signals propagating within the simulation model 10, the computing device 30, includes means, such as the processing circuitry 32 or the like, for performing a unit test upon the simulation model using a test harness to confirm proper operation of the simulation model. See block 50 of FIG. 4. As described above, the unit test may be performed upon the simulation model by evaluating the output provided by the simulation model in response to one or more inputs to the simulation model. In an instance in which the unit test is determined to be unsuccessful as shown in block 52, the simulation model may also be subjected to as the troubleshooting procedure of block 48 in order to debug the simulation model.

However, in an instance in which the unit test is determined to be successful as shown in block 52 and, more particularly, in an instance in which all of the simulation models to be integrated have been determined to be successful, the computing device 30 includes means, such as the processing circuitry 32 or the like, for integrating the plurality of simulation models to form a system model. See block 54. Although not depicted in FIG. 4, the system model may also be subjected to an integration test and/or system test to ensure proper operation or to identify instances in which the resulting system model does not perform as anticipated and in which a troubleshooting procedure should be performed. In some embodiments, groups of the simulation models (but less than all of the simulation models that form the system model) may be integrated and subjected to an integration test (with any group of simulation models that fail an integration test being subjected to a troubleshooting procedure) prior to integrating the groups of simulation models into the system model and subjecting the resulting system model to a system test.

By having subjected the simulation model 10 to simulation assessment by the simulation assessment module 18 to verify the one or more signals propagating through the simulation model (or to identify an instance in which a troubleshooting procedure should be performed), the number of instances in which the unit test, the integration test and/or the system test fails to verify a respective simulation model or the system model may be reduced. Thus, the efficiency with which the system model is designed and verified will be enhanced since it will be more efficient to troubleshoot and debug individual simulation models prior to integration as opposed to troubleshooting the system model or groups of simulation models following integration.

By way of example of a simulation of a simulation model 10 that is supported by a simulation assessment module 18, FIG. 7 depicts the operations performed, such as by the computing device 30 of FIG. 3, in conjunction with an example embodiment. As shown in block 70, the computing device includes means, such as the processing circuitry 32 or the like, for performing a simulation of the simulation model, thereby executing a simulation run. The performance of the simulation may be, for example, in response to an instruction provided by the designer of the simulation model to perform the simulation. The computing device of this example embodiment also includes means, such as the processing circuitry, for determining whether the simulation assessment module has been enabled, such as in response to a selection by the designer via a graphical user interface 60 in which the simulation assessment module was configured. See block 72. In an instance in which the simulation assessment module has not been enabled, the simulation assessment module will not operate during the simulation of the simulation model. See block 74.

However, in an instance in which the simulation assessment module 18 has been enabled, the computing device 30 includes means, such as the processing circuitry 32, for identifying the signals at the entry ports of the simulation assessment module. See block 76. With respect to the simulation assessment module of FIG. 1, the signals that the entry ports of the simulation assessment module are outputs X and Y representative of the outputs of the limiter 16 and the amplifier 14, respectively. By way of another example, with respect to the simulation assessment module of FIG. 2, the signals that the entry ports of the simulation assessment module are inputs 1 and 3 defining the upper and lower limits, respectively of a range. The computing device of this example embodiment also includes means, such as the processing circuitry, for parsing the verification logic of the simulation assessment module in order to match the variables defined by the verification logic with the signals that identify that the entry ports to the simulation assessment module. See block 78.

In the example embodiment depicted in FIG. 7, the computing device 30 also includes means, such as the processing circuitry 32, for determining whether the variables defined by the verification logic match the entry ports of the simulation assessment module 18. See block 80. For example, the computing device, such as the processing circuitry, may be configured to determine whether the variables defined in relation to the verification logic provided by the model designer via the graphical user interface 60 correspond to signals defined to be propagating through the simulation model 10 and associated with entry ports of the simulation assessment module. In an instance in which the verification logic is determined by the computing device, such as the processing circuitry, to be invalid, such as in an instance in which the verification logic identifies signals that do not propagate through the simulation model or that are not associated with an entry port of the simulation assessment module, the operation of the simulation assessment module may terminate, e.g., exit, and a message may be provided indicating that the verification logic is invalid.

However, in an instance in which the verification logic is determined to be valid by block 80, the computing device 30 of the illustrated embodiment includes means, such as the processing circuitry 32, for determining whether the verification logic of the simulation assessment module 18 is satisfied during the current time instance of the simulation run. See block 82. In at least some embodiments, the simulation performed by the simulation assessment module is performed for each of a plurality of sequential instances of time such that the operation of the simulation model 10 over the course of time in response to a variety of input signals can be monitored. In an instance in which the verification logic is not satisfied by a particular instance of the simulation run, the simulation assessment module determines the type of response, e.g., warning or error, to be provided as shown in block 84. In an example embodiment relative to FIG. 1 in which the verification logic determines whether the absolute value of the output X is less than or equal to the absolute value of output Y for every time instance, the computing device, such as the processing circuitry, may be configured to determine that the verification logic is not met in an instance in which the absolute value of output X exceeds the absolute value of output Y in some instances. By way of another example with respect to FIG. 2 in which the verification logic requires the value of the upper limit of the range as defined by input 1 to exceed the value of the lower limit of the range as defined by input 3, the processing circuitry may be configured to determine that the verification logic is not met in an instance in which input 3 is greater than input 1 in some circumstances.

With respect to the response to be provided by the simulation assessment module 18, in an example embodiment in which the graphical user interface 60 permits the model designer who configures the simulation assessment module to define the response to be an error or a warning, the computing device 30 includes means, such as the processing circuitry 32, for determining whether the response to be provided has been selected to be a warning. In an instance in which the response has not been selected to be a warning and, as a result, is considered to be an error, the computing device of this example embodiment includes means, such as the processing circuitry, for halting the simulation and means, such as the processing circuitry, the communication interface 36, the user interface 38 or the like, for providing an indication of an error, namely, that the verification logic associated with the simulation assessment module was violated. See block 86. However, in an instance in which the response to be provided in an instance in which the verification logic is not satisfied is to be a warning, the computing device includes means, such as the processing circuitry, the communication interface, the user interface or the like, for providing the warning, such as by presenting the warning via the user interface to the model designer and/or by recording the warning, such as by logging the warning for storage, such as by the memory device 34 or a database with which the computing device is in communication. See block 88.

In an instance in which the warning is logged, information associated with the violation or verification logic may also be logged for use in analyzing the violation, such as during a troubleshooting procedure. Although a variety of information may be logged, examples of the information that may be logged include the time at which the verification logic was violated, the values of the signals at the entry ports of the simulation assessment module 18 at the time at which the verification logic was not satisfied, and, in some embodiments, the values of the signals at the entry ports of the simulation assessment module at one or more time instances prior to the time instance at which the verification logic was violated. After logging the data, the computing device 30, such as the processing circuitry 32, may proceed to the next time step of the simulation.

In an instance in which the verification logic is satisfied, however, the computing device 30 of an example embodiment includes means, such as the processing circuitry 32, for determining whether the simulation assessment module 18 is configured to log data associated with the operation of the simulation assessment module. See block 90. In an instance in which the simulation assessment module has been configured to log data associated with the operation of the simulation assessment module, the computing device includes means, such as the processing circuitry, the memory device 34 or the like, for logging the data, such as by providing the data for storage, such as by the memory device or by a database with which the computing device is in communication. See block 92. While a variety of data may be logged, examples of the information that may be logged include the values of the signals at the entry ports of the simulation assessment module 18 at each of a plurality of different time instances.

In the illustrated embodiment and regardless of whether the verification logic is satisfied or not and regardless of whether data is to be logged or not, the computing device 30 of includes means, such as the processing circuitry 32, for determining whether the evaluation of the simulation assessment module 18 has been completed, such as by being performed for the final time instance. See block 94. In an instance in which the computing device, such as the processing circuitry, determines that the operation of the simulation assessment module has been performed for the final time instance (e.g., final time step), the simulation is halted. See block 98. However, in an instance in which the computing device, such as the processing circuitry, determines that the operation of the simulation assessment module has not been performed for the final time instance, the computing device, such as the processing circuitry, is configured to repeat the process of determining whether the verification logic is satisfied sequentially for each subsequent time instance by proceeding to the next time step. See block 96. As shown in the example embodiment at FIG. 7, however, the computing device, such as the processing circuitry, need not determine whether the simulation assessment module has been enabled, need not identify the signals at the entry ports of the simulation assessment module, need not parse the verification logic to identify the signals to be considered by the verification logic and need not validate the verification logic for each subsequent time instance, but, instead, only for the initial time instance, thereby increasing the efficiency with which the simulation assessment module performs the simulation for a plurality of sequential instances in time.

As described above, following the performance of a successful verification of the signals propagating through a simulation model 10 by the simulation assessment module 18, a unit test may be performed relative to the simulation model or a group of simulation models that have been integrated. The unit test generally considers the output(s) of a simulation model over the course of time as different sets of input(s) are provided to the simulation assessment module in order to determine if the simulation model performs as intended. In an example embodiment, the computing device 30, such as the processing circuitry 32, is configured to perform the unit test based at least in part upon results of the simulation assessment module in conjunction with the verification of signals propagating through the simulation model.

Although the unit test may be based upon the results of the verification of the one or more signals propagating through the simulation model 10 in various manners, FIG. 8 depicts an example embodiment of the manner in which the results provided by the simulation assessment module 18 may be utilized in conjunction with the performance of a unit test. As referenced herein, unit tests are associated with the formal tests necessary to satisfy the model requirements. As shown in FIG. 8, the simulation assessment module is initially added to the simulation model and is enabled for operation and for the logging of data associated with operation of a simulation assessment module. See blocks 100 and 102. Thereafter, one or more simulations are run and the data associated with these simulations is logged by the simulation assessment module. See block 104. The data that has been logged is then accessed and one or more simulation runs are selected, such as by the model designer. See blocks 106 and 108. In an instance in which the data logged in conjunction with one or more simulation runs by the simulation assessment module is to be utilized to support the performance of the unit test (e.g., converted), an empty model that will become the test harness is created, such as in the memory device 34, and the simulation assessment module automatically identifies the unit under test by copying the logic that connects the inputs to the simulation assessment module. See block 110. With respect to the example simulation model of FIG. 1, the logic that connects the inputs to the simulation assessment module provides outputs X and Y to the simulation assessment module for the purpose of comparing the absolute value of output Y to the absolute value of output X to determine whether the absolute value of output X is less than or equal to the absolute value of output Y.

The unit under test is then identified and added to the empty model. See block 112. The input data that has been logged in conjunction with the simulation conducted by the simulation assessment module 18 is then selected to be provided as the totality or at least part of the inputs to the test harness. See block 114. The output data provided by the simulation assessment module in response to application of verification logic to the input data is then correspondingly selected and is then added as the totality or at least part of the expected outputs for the unit test. See block 116. The computing device 30, such as the processing circuitry 32, may then be configured to determine whether the output data that has been selected satisfies the unit test based upon the input data that has been provided. As a result, the unit test may be performed in a more efficient manner by relying upon verification results performed by the simulation assessment module.

In this regard, if the simulation assessment module 18 addressed signals that are part of the set of inputs of the model, these and their corresponding assessments and logouts may be leveraged in the creation of the unit test of the model, as some of (or even the totality of) the model inputs would have been already evaluated by the simulation assessment module. The same would apply for the model outputs. Thus, the computing device 30 of an example embodiment is able to partially (or fully) automate the addition of inputs and/or expected outputs while the model developer is creating the unit test. The results that the unit test would provide may be different from the results provided by the simulation assessment module(s), because the results of the unit test would include the entire set of inputs and expected outputs of the model, while the results provided by the simulation assessment module(s) may only address a subset of the totality of inputs and expected outputs of the model. In an embodiment in which the simulation assessment module(s) had only addressed signals that are internal to the simulation model, i.e. signals that are neither model inputs nor model outputs, then the result of the verification logic of the simulation assessment module may still be useful to debug and troubleshoot the model in case the unit test fails, since the portion of the model verified by the simulation assessment modules would not be causing the failure of the unit test such that the developer can focus on other portions of the model while debugging, therefore saving time.

Although not all the verification that is performed by the simulation assessment module 18 is associated with formal requirements addressed by a unit test, some of the verification performed by the simulation assessment module may be associated with and satisfy the formal requirements, thereby avoiding the creation of a unit test to verify the same formal requirements. Also, the verification performed by a simulation assessment module may be added to the formal test documents that are used to evidence the verification of the system and that are provided as proof to stakeholders that the system is operating according to its intended use.

A computing device 30, method and computer program produce are therefore provided to facilitate the development of a system model, the operation of which may be verified in an efficient manner. In this regard, the computing device, method and computer program product of an example embodiment utilize simulation assessment modules 18 to verify one or more signals propagating within a simulation model 10 from which the system model is constructed. As a result, the performance of a simulation model may be verified at a low level prior to integration with other simulation models and simulation models that do not perform as anticipated may undergo a troubleshooting process prior to integration to debug the simulation model in an efficient manner. As a result, the integration tests and system tests that are subsequently performed following the integration of a plurality of simulation models can be successfully verified in a greater number of instances as a result of having identified and corrected any issues with the simulation models prior to the integration, thereby increasing the efficiency with which a system model may be developed.

As described above, FIGS. 4, 7 and 8 illustrate flowcharts of a computing device 30, method, and computer program product according to example embodiments of the present disclosure. It will be understood that each block of the flowcharts, and combinations of blocks in the flowcharts, may be implemented by various means, such as hardware and/or a computer program product comprising one or more computer-readable storage mediums having computer readable program instructions stored thereon. For example, one or more of the procedures described herein may be embodied by computer program instructions of a computer program product. In this regard, the computer program product(s) which embody the procedures described herein may be stored by one or more memory devices 34 of a computing device 30 and executed by a processing circuitry 32 of the computing device. In some embodiments, the computer program instructions comprising the computer program product(s) which embody the procedures described above may be stored by a plurality of memory devices. As will be appreciated, any such computer program product may be loaded onto a computer or other programmable apparatus to produce a machine, such that the computer program product including the instructions which execute on the computer or other programmable apparatus creates means for implementing the functions specified in the flowchart blocks. Further, the computer program product may comprise one or more computer-readable memories on which the computer program instructions may be stored such that the one or more computer-readable memories can direct a computer or other programmable apparatus to function in a particular manner, such that the computer program product comprises an article of manufacture which implements the function specified in the flowchart blocks. The computer program instructions of one or more computer program products may also be loaded onto the computing system or other programmable apparatus to cause a series of operations to be performed on the computing system or other programmable apparatus to produce a computer-implemented process such that the instructions which execute on the computing system or other programmable apparatus implement the functions specified in the flowchart blocks.

Accordingly, blocks or steps of the flowcharts support combinations of means for performing the specified functions and combinations of steps for performing the specified functions. It will also be understood that one or more blocks of the flowcharts, and combinations of blocks in the flowcharts, may be implemented by special purpose hardware-based computer systems which perform the specified functions or steps, or combinations of special purpose hardware and computer program products.

Further, the disclosure comprises the following examples, whereby the scope of protection is provided by the claims.

Example 1. A method for developing a system model, the method comprising: designing a simulation model configured to digitally simulate a corresponding portion of a system; associating a simulation assessment module with the simulation model, wherein the simulation assessment module is configured to verify one or more signals propagating within the simulation model; in an instance in which the simulation assessment module has verified the one or more signals, performing a unit test upon the simulation model using a test harness to confirm proper operation of the simulation model; and in an instance in which the unit test is successful, integrating a plurality of simulation models to form the system model.

Example 2. The method of Example 1, wherein the simulation model has one or more inputs and one or more outputs, wherein performing the unit test comprises evaluating the one or more outputs of the simulation model in response to one or more inputs, and wherein the simulation assessment module is configured to verify one or more internal signals that are propagating within the simulation model and that are different than the one or more outputs of the simulation model.

Example 3. The method of any of Examples 1-2, wherein associating the simulation assessment module with the simulation model comprises defining verification logic implemented by the simulation assessment module.

Example 4. The method of any of Examples 1-3, wherein associating the simulation assessment module with the simulation model comprises defining a response to a failure to verify the one or more signals propagating within the simulation model.

Example 5. The method of any of Examples 1-4, wherein associating the simulation assessment module with the simulation model comprises defining whether data associated with verification of the one or more signals propagating within the simulation model is to be logged.

Example 6. The method of any of Examples 1-5, wherein associating the simulation assessment module with the simulation model comprises associating a plurality of simulation assessment modules with the simulation model, wherein each simulation assessment module is configured to verify one or more different signals or different relationships between signals propagating within the simulation model.

Example 7. The method of any of Examples 1-6, wherein performing the unit test upon the simulation model comprises creating the unit test based at least in part upon verification results of the simulation assessment module.

Example 8. The method of any of Examples 1-7, wherein the simulation assessment module is configured to verify a relationship of two or more signals or a value of one or more signals.

Example 9. A computing device configured to develop a system model, the computing device comprising processing circuitry configured to: receive input to design a simulation model configured to digitally simulate a corresponding portion of a system; associate a simulation assessment module with the simulation model, wherein the simulation assessment module is configured to verify one or more signals propagating within the simulation model; in an instance in which the simulation assessment module has verified the one or more signals, perform a unit test upon the simulation model using a test harness to confirm proper operation of the simulation model; and in an instance in which the unit test is successful, integrate a plurality of simulation models to form the system model.

Example 10. The computing device of Example 9, wherein the simulation model has one or more inputs and one or more outputs, wherein the processing circuitry is configured to perform the unit test by evaluating the one or more outputs of the simulation model in response to one or more inputs, and wherein the simulation assessment module is configured to verify one or more internal signals that are propagating within the simulation model and that are different than the one or more outputs of the simulation model.

Example 11. The computing device of any of Examples 9-10, wherein the processing circuitry is configured to associate the simulation assessment module with the simulation model by defining verification logic implemented by the simulation assessment module.

Example 12. The computing device of any of Examples 9-11, wherein the processing circuitry is configured to associate the simulation assessment module with the simulation model by defining a response to a failure to verify the one or more signals propagating within the simulation model.

Example 13. The computing device of any of Examples 9-12, wherein the processing circuitry is configured to associate the simulation assessment module with the simulation model by defining whether data associated with verification of the one or more signals propagating within the simulation model is to be logged.

Example 14. The computing device of any of Examples 9-13, wherein the processing circuitry is configured to associate the simulation assessment module with the simulation model by associating a plurality of simulation assessment modules with the simulation model, wherein each simulation assessment module is configured to verify one or more different signals or different relationships between signals propagating within the simulation model.

Example 15. The computing device of any of Examples 9-14, wherein the processing circuitry is configured to perform the unit test upon the simulation model by creating the unit test based at least in part upon verification results of the simulation assessment module.

Example 16. The computing device of any of Examples 9-15, wherein the simulation assessment module is configured to verify a relationship of two or more signals or a value of one or more signals.

Example 17. A computer program product configured to develop a system model, the computer program product comprising a non-transitory computer readable medium having program code stored thereon with the program code including program code instructions configured, upon execution, to: receive input to design a simulation model configured to digitally simulate a corresponding portion of a system; associate a simulation assessment module with the simulation model, wherein the simulation assessment module is configured to verify one or more signals propagating within the simulation model; in an instance in which the simulation assessment module has verified the one or more signals, perform a unit test upon the simulation model using a test harness to confirm proper operation of the simulation model; and in an instance in which the unit test is successful, integrate a plurality of simulation models to form the system model.

Example 18. The computer program product of Example 17, wherein the simulation model has one or more inputs and one or more outputs, wherein the program code instructions configured to perform the unit test comprise program code instructions configured to evaluate the one or more outputs of the simulation model in response to one or more inputs, and wherein the simulation assessment module is configured to verify one or more internal signals that are propagating within the simulation model and that are different than the one or more outputs of the simulation model.

Example 19. The computer program product of any of Examples 17-18, wherein the program code instructions configured to associate the simulation assessment module with the simulation model comprise program code instructions configured to define verification logic implemented by the simulation assessment module.

Example 20. The computer program product of any of Examples 17-19, wherein the program code instructions configured to associate the simulation assessment module with the simulation model comprise program code instructions configured to define a response to a failure to verify the one or more signals propagating within the simulation model.

The above described functions may be carried out in many ways. For example, any suitable means for carrying out each of the functions described above may be employed to carry out embodiments of the present disclosure. In one embodiment, a suitably configured computing system 30 may provide all or a portion of the elements of the present disclosure. In another embodiment, all or a portion of the elements may be configured by and operate under control of a computer program product. The computer program product for performing the methods of embodiments of the present disclosure includes a computer-readable storage medium, such as the non-volatile storage medium, and computer-readable program code portions, such as a series of computer instructions, embodied in the computer-readable storage medium.

Many modifications and other aspects of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific aspects disclosed and that modifications and other aspects are intended to be included within the scope of the appended claims. Although specific terms are employed herein, they are used in a generic and descriptive sense only and not for purposes of limitation.

The invention claimed is:

1. A method for developing a system model, the method comprising:
designing a simulation model configured to digitally simulate a corresponding portion of a system;
associating a simulation assessment module with the simulation model, wherein the simulation assessment module is configured to verify one or more signals propagating within the simulation model;
in an instance in which the simulation assessment module has verified the one or more signals, performing a unit test upon the simulation model using a test harness to confirm proper operation of the simulation model; and
in an instance in which the unit test is successful, integrating a plurality of simulation models to form the system model.

2. The method of claim 1, wherein the simulation model has one or more inputs and one or more outputs, wherein performing the unit test comprises evaluating the one or more outputs of the simulation model in response to one or more inputs, and wherein the simulation assessment module is configured to verify one or more internal signals that are propagating within the simulation model and that are different than the one or more outputs of the simulation model.

3. The method of claim 1, wherein associating the simulation assessment module with the simulation model comprises defining verification logic implemented by the simulation assessment module.

4. The method of claim 1, wherein associating the simulation assessment module with the simulation model comprises defining a response to a failure to verify the one or more signals propagating within the simulation model.

5. The method of claim 1, wherein associating the simulation assessment module with the simulation model comprises defining whether data associated with verification of the one or more signals propagating within the simulation model is to be logged.

6. The method of claim 1, wherein associating the simulation assessment module with the simulation model comprises associating a plurality of simulation assessment modules with the simulation model, wherein each simulation assessment module is configured to verify one or more different signals or different relationships between signals propagating within the simulation model.

7. The method of claim 1, wherein performing the unit test upon the simulation model comprises creating the unit test based at least in part upon verification results of the simulation assessment module.

8. The method of claim 1, wherein the simulation assessment module is configured to verify a relationship of two or more signals or a value of one or more signals.

9. A computing device configured to develop a system model, the computing device comprising processing circuitry configured to:
receive input to design a simulation model configured to digitally simulate a corresponding portion of a system;
associate a simulation assessment module with the simulation model, wherein the simulation assessment module is configured to verify one or more signals propagating within the simulation model;
in an instance in which the simulation assessment module has verified the one or more signals, perform a unit test upon the simulation model using a test harness to confirm proper operation of the simulation model; and
in an instance in which the unit test is successful, integrate a plurality of simulation models to form the system model.

10. The computing device of claim 9, wherein the simulation model has one or more inputs and one or more outputs, wherein the processing circuitry is configured to perform the unit test by evaluating the one or more outputs of the simulation model in response to one or more inputs, and wherein the simulation assessment module is configured to verify one or more internal signals that are propagating within the simulation model and that are different than the one or more outputs of the simulation model.

11. The computing device of claim 9, wherein the processing circuitry is configured to associate the simulation assessment module with the simulation model by defining verification logic implemented by the simulation assessment module.

12. The computing device of claim 9, wherein the processing circuitry is configured to associate the simulation assessment module with the simulation model by defining a response to a failure to verify the one or more signals propagating within the simulation model.

13. The computing device of claim 9, wherein the processing circuitry is configured to associate the simulation assessment module with the simulation model by defining whether data associated with verification of the one or more signals propagating within the simulation model is to be logged.

14. The computing device of claim 9, wherein the processing circuitry is configured to associate the simulation assessment module with the simulation model by associating a plurality of simulation assessment modules with the simulation model, wherein each simulation assessment module is configured to verify one or more different signals or different relationships between signals propagating within the simulation model.

15. The computing device of claim 9, wherein the processing circuitry is configured to perform the unit test upon the simulation model by creating the unit test based at least in part upon verification results of the simulation assessment module.

16. The computing device of claim 9, wherein the simulation assessment module is configured to verify a relationship of two or more signals or a value of one or more signals.

17. A computer program product configured to develop a system model, the computer program product comprising a non-transitory computer readable medium having program code stored thereon with the program code including program code instructions configured, upon execution, to:
receive input to design a simulation model configured to digitally simulate a corresponding portion of a system;
associate a simulation assessment module with the simulation model, wherein the simulation assessment module is configured to verify one or more signals propagating within the simulation model;
in an instance in which the simulation assessment module has verified the one or more signals, perform a unit test upon the simulation model using a test harness to confirm proper operation of the simulation model; and
in an instance in which the unit test is successful, integrate a plurality of simulation models to form the system model.

18. The computer program product of claim 17, wherein the simulation model has one or more inputs and one or more outputs, wherein the program code instructions configured to perform the unit test comprise program code instructions configured to evaluate the one or more outputs of the simulation model in response to one or more inputs, and wherein the simulation assessment module is configured to verify one or more internal signals that are propagating within the simulation model and that are different than the one or more outputs of the simulation model.

19. The computer program product of claim 17, wherein the program code instructions configured to associate the simulation assessment module with the simulation model comprise program code instructions configured to define verification logic implemented by the simulation assessment module.

20. The computer program product of claim 17, wherein the program code instructions configured to associate the simulation assessment module with the simulation model comprise program code instructions configured to define a response to a failure to verify the one or more signals propagating within the simulation model.

* * * * *